United States Patent [19]

Kung et al.

[11] E Patent Number: Re. 31,663

[45] Reissued Date of Patent: Sep. 4, 1984

[54] DYNAMIC OUTPUT BUFFER

[75] Inventors: Roger I. Kung, Beaverton, Oreg.; Jerry D. Moench, Austin, Tex.

[73] Assignee: Motorola, Inc., Schaumburg, Ill.

[21] Appl. No.: 376,795

[22] Filed: May 10, 1982

Related U.S. Patent Documents

Reissue of:

[64] Patent No.: 4,250,412
Issued: Feb. 10, 1981
Appl. No.: 17,748
Filed: Mar. 5, 1979

[51] Int. Cl.[3] ..... H03K 3/26; H03K 5/22
[52] U.S. Cl. ..... 307/530; 307/475
[58] Field of Search ..... 307/530, 475

[56] References Cited

U.S. PATENT DOCUMENTS

| | | | |
|---|---|---|---|
| 3,363,115 | 1/1968 | Stephenson | 307/279 |
| 4,038,567 | 7/1977 | Lewis et al. | 307/355 |
| 4,081,701 | 3/1978 | White et al. | 307/530 |
| 4,146,802 | 3/1979 | Moench | 307/279 |
| 4,280,070 | 6/1981 | Reese et al. | 307/475 |
| 4,353,104 | 10/1982 | Takayuki | 307/475 |

OTHER PUBLICATIONS

"Output Sense and Buffer", Drawing MK4116-032, MOS Aid.

*Primary Examiner*—Harold Dixon
*Attorney, Agent, or Firm*—Anthony J. Sarli, Jr.; Jeffrey Van Myers; James L. Clingan, Jr.

[57] ABSTRACT

There is provided a dynamic output buffer useful for providing output data from a memory. The output buffer includes a cross coupled sense amplifier having inputs and outputs. The outputs of this sense amplifier are coupled by output transistors to the output of the dynamic output buffer. The outputs of the cross coupled sense amplifier are also coupled to dynamic load devices which are used to prevent the outputs from deteriorating when the inputs are shunted or clamped to ground. The inputs are clamped to ground by transistors which are controlled by timing signals and thereby insure that data stored by the cross coupled sense amplifier will not be lost.

3 Claims, 2 Drawing Figures

DYNAMIC OUTPUT BUFFER

Matter enclosed in heavy brackets [ ] appears in the original patent but forms no part of this reissue specification; matter printed in italics indicates the additions made by reissue.

This invention relates, in general, to output buffers, and more particularly, to output buffers useful in digital memories.

Buffers are used to buffer data from a memory to outside circuitry. The most common type of buffer used includes a cross coupled sense amplifier. In MOS circuitry it is common to have the cross coupled sense amplifier enabled by one clock signal. However, because of the bidirectional conductivity of MOS transistors it is necessary to take special precautions with the clock signal, and the circuitry providing the clock signal, to insure that data stored in the cross coupled sense amplifier is not lost or discharged back through the clock signal circuitry when the clock signal is in a non-enabling state.

Accordingly, it is an object of the present invention to provide an improved dynamic output buffer which is capable of holding output data for long periods of time without appreciable deterioration of the data.

Another object of the present invention is to provide an improved dynamic output buffer wherein the output data is maintained at substantially a constant amplitude even during switching of internal transistors of the buffer itself.

SUMMARY OF THE INVENTION

In carrying out the above and other objects of the present invention, there is provided in one form, a dynamic output buffer having a cross coupled sense amplifier which is used to receive the input data so that it can be outputted by output driver transistors upon command. Field effect transistors, which are controlled by timing signals, are used to disconnect the cross coupled sense amplifier inputs from external circuitry. The circuit also includes additional dynamic loads coupled to the outputs of the cross coupled sense amplifier to restore or boost the output at the same time that the inputs are being disconnected from the external circuitry thereby preventing outputs of the cross coupled sense amplifier from decreasing substantially in amplitude.

The subject matter which is regarded as the invention is set forth in the appended claims. The invention itself, however, together with further objects and advantages thereof, may be better understood by referring to the following detailed description taken in conjunction with the accompanying drawings.

DETAILED DESCRIPTION OF THE DRAWINGS

Figure 1:
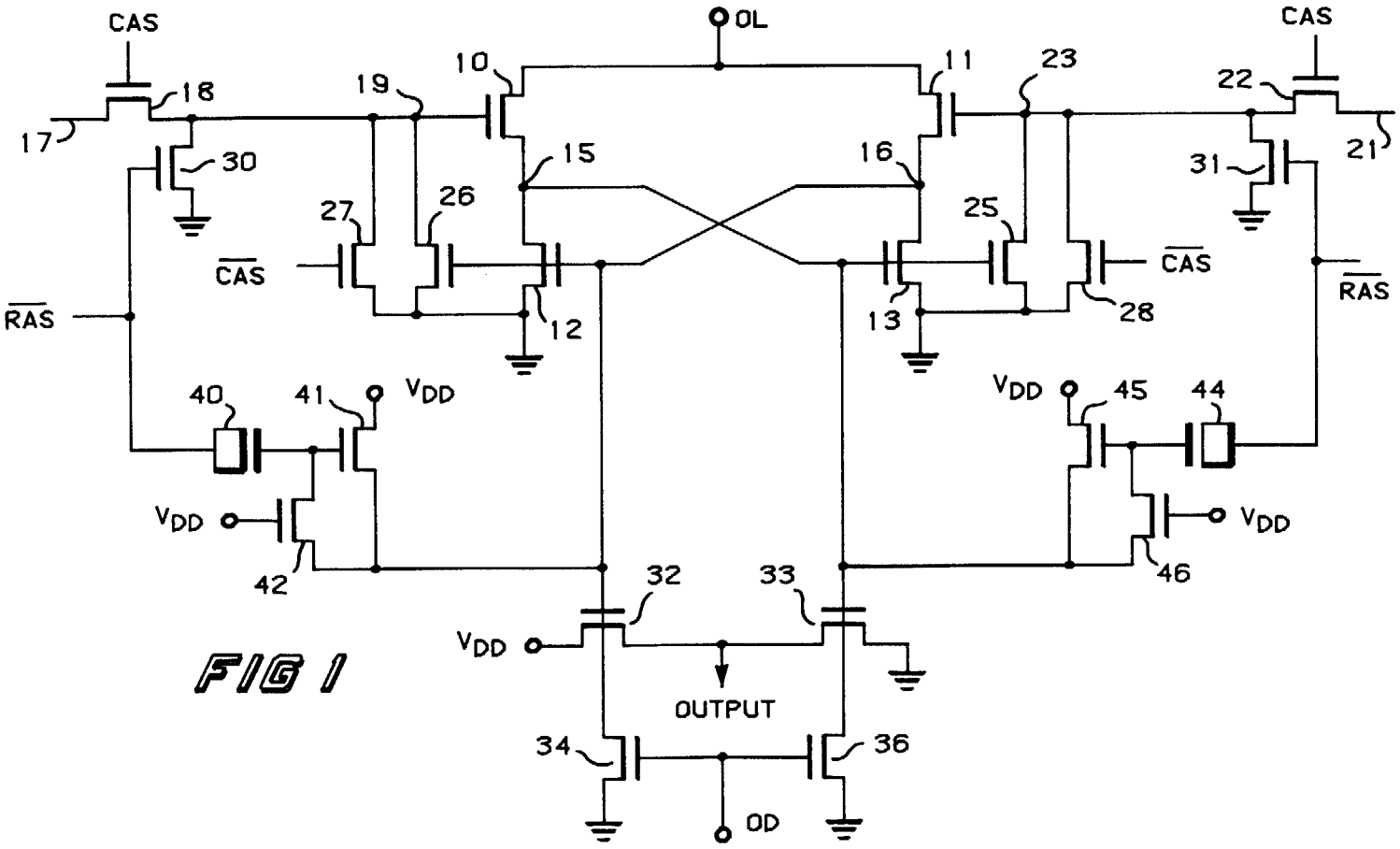
FIG. 1 illustrates, in schematic form, an embodiment of the invention.

FIG. 1 illustrates a dynamic output buffer useful for receiving data from within a memory and coupling it to the output of the memory itself. The dynamic output buffer receives data on lines 17 and 21 and stores the data in a cross coupled sense amplifier having transistors 10, 11, 12, and 13. Transistors 10 and 12 are coupled in series between an output latch clock signal OL and a reference terminal illustrated as ground. Transistors 11 and 13 are coupled in parallel with transistors 10 and 12. A node 15 which is formed between transistors 10 and 12 serves as one output for the cross coupled sense amplifier, and node 16 formed between transistors 11 and 13 serve as another output for the cross coupled sense amplifier. Transistor 12 has its gate electrode coupled to node 16, and transistor 13 has its gate electrode coupled to node 15. Transistor 10 has its gate electrode coupled to node 19 which serves as an input for the cross coupled sense amplifier, and transistor 11 has its gate electrode coupled to node 23 which serves as another input for the cross coupled sense amplifier. Node 19 is coupled to line 17 by transistor 18. Transistor 18 is enabled by a column address strobe CAS applied to its gate electrode. Node 23 is coupled to line 21 by transistor 22 which has its gate electrode enabled by the same timing signal CAS as transistor 18.

The input signals to the cross coupled sense amplifier are complements of each other. If it is assumed that node 19 has an input signal sitting at a high level, which would mean the input signal at node 23 would be at a low level, then when clock signal OL goes high, transistor 10 would conduct thereby driving node 15 high. Since node 15 is coupled to the gate electrode of transistor 13, transistor 13 would conduct thereby placing node 16 at a low level. Transistor 12 would remain in a non-conducting state since its gate electrode is coupled to node 16. Node 15 is also coupled to a gate electrode of transistor 25. Transistor 25 is coupled between input node 23 and ground. Since node 15 was assumed to be at a high level, transistor 25 will conduct thereby maintaining input node 23 at a low level. As long as clock signal OL is high, and timing signals $\overline{RAS}$ and $\overline{CAS}$ are low, node 15 will remain high and OUTPUT data will be valid. Before clock signal OL goes low, timing signals $\overline{CAS}$ and $\overline{RAS}$ go high which causes node 19 to discharge to ground and effectively turns off transistor 10 thereby isolating node 15 from the circuitry which provides clock signal OL. This insures that node 15 remains at a high level.

Transistor 28 is in parallel with transistor 25 and has its gate electrode coupled to the complement column address strobe timing signal $\overline{CAS}$. Another transistor 31 is in parallel with transistor 28 and has its gate electrode coupled to a complement row address strobe timing signal $\overline{RAS}$. Transistors 28 and 31 will maintain node 23 at a low level when their gate electrodes are enabled. In certain situations, timing signal $\overline{CAS}$ may be delayed and therefore timing signal $\overline{RAS}$ will insure that node 23 is maintained at a low level. Input node 19 also has three transistors 26, 27, and 30 coupling it to ground. Transistor 26 has its gate electrode coupled to node 16, transistor 27 has its gate electrode coupled to timing signal CAS, and transistor 30 has its gate electrode coupled to timing signal $\overline{RAS}$. Transistors 26, 27 and 30 operate in a similar manner to that explained, hereinbefore, for transistors 25, 28 and 31 and serve to shunt or clamp input 19 to ground.

Output node 15 is coupled to a gate electrode of transistor 33, and output node 16 is coupled to a gate electrode of transistor 32. Transistors 32 and 33 are in series between a voltage potential terminal $V_{DD}$ and ground. The output for the dynamic output buffer is provided from an OUTPUT node between transistors 32 and 33. If node 16 goes high transistor 32 conducts and the OUTPUT node goes high. If output node 15 goes high, transistor 33 will conduct thereby providing a low level at the OUTPUT node. Transistor 34 is coupled from output node 16 to ground, and transistor 36 is coupled from output node 15 to ground. Transistors 34 and 36 both have their gate electrodes coupled to a control signal which is used as an output disable OD. When control signal OD is at a high level, transistors 34 and 36 will conduct thereby discharging output nodes 15 and 16 and rendering transistors 32 and 33 non-conductive which causes the OUTPUT node to float or go to a high impedance state. The output transistors are in a state to be enabled when output disable OD is at a low level.

Output node 16 has a voltage restorer comprising transistors 41 and 42 and capacitor 40 coupled to it. If node 16 is sitting at a high level and timing signal $\overline{RAS}$ goes high thereby enabling transistor 31, input node 23 can be caused to move to a low level which can be capacitively coupled through transistor 11 to output node 16 causing a decrease in the signal level at output node 16. To alleviate this potential problem, a restorer circuit or glitch eliminator is coupled to output node 16. Transistor 41 is coupled between voltage terminal $V_{DD}$ and output node 16. Transistor 42 is coupled between the gate electrode of transistor 41 and output node 16. Transistor 42 has its gate electrode coupled to voltage potential $V_{DD}$ and therefore transistor 42 will be enabled. When the timing signal $\overline{RAS}$ goes high, capacitor 40 will couple this high level to the gate electrode of transistor 41 causing transistor 41 to conduct thereby boosting output node 16. If output node 16 is sitting at a low level, this low level would be reflected through transistor 42 to the gate electrode of transistor 41 and when capacitor 40 couples an increasing $\overline{RAS}$ to the gate electrode of transistor 41, transistor 42 will tend to keep the gate electrode at a low level thereby preventing transistor 41 from conducting. Output node 15 also has a voltage restoring circuit coupled to it which operates in the same manner as does the voltage restoring circuit for output node 16. Transistor 45 is coupled from voltage $V_{DD}$ to output node 15, and transistor 46 is coupled from the gate electrode of transistor 45 to output node 15. A coupling capacitor 44 is coupled from the gate electrode of transistor 45 to timing signal $\overline{RAS}$. Capacitors 40 and 44 can be implemented as MOS transistors. For example, the capacitors can be field effect transistors having their drain and source electrodes connected together to input timing signal $\overline{RAS}$ while their gate electrode is coupled to the gate electrode of transistor 41 or 45.

Figure 2:
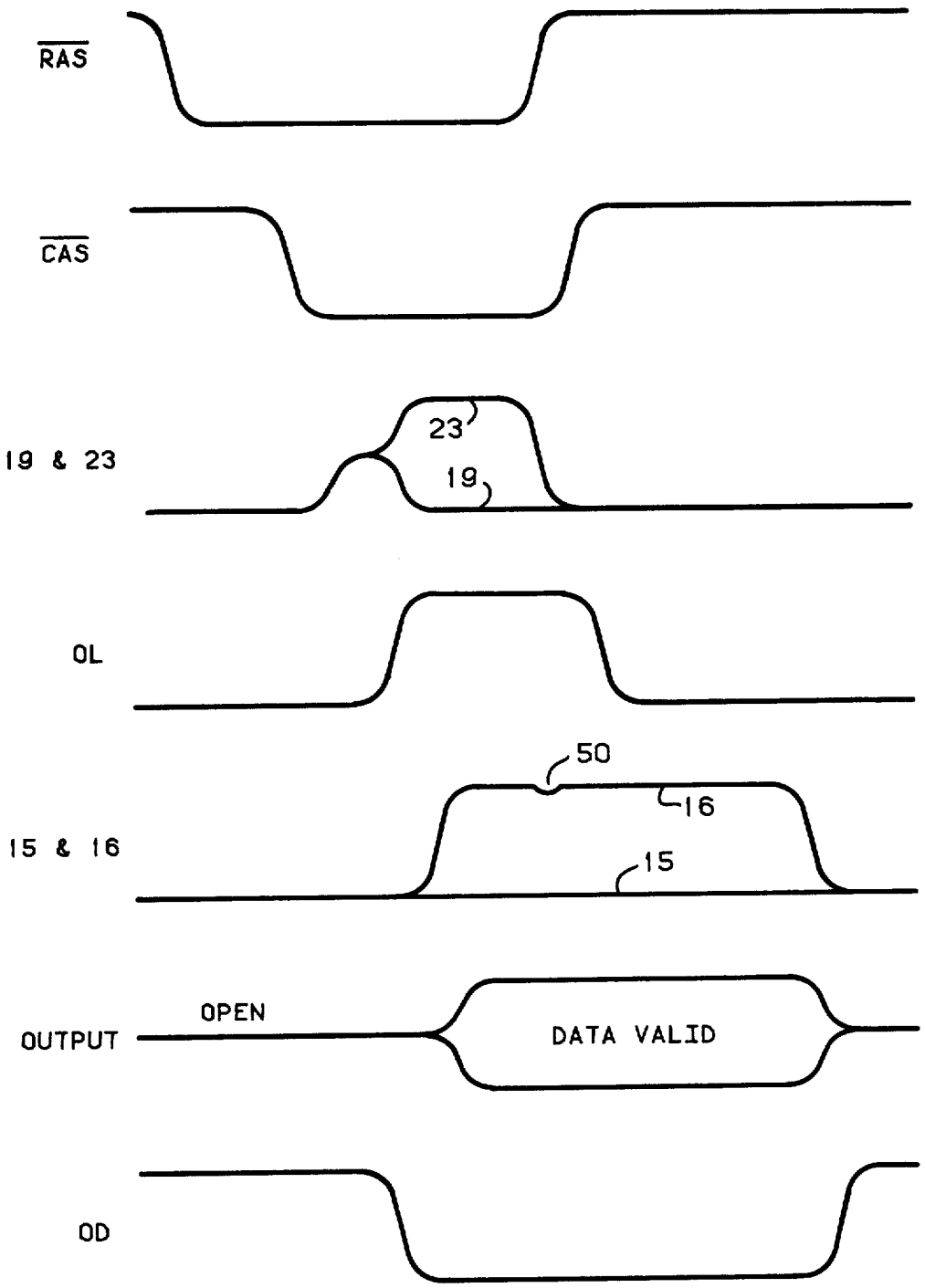
FIG. 2 is a timing diagram useful in understanding the operation of the circuitry of FIG. 1.

Timing waveforms found in the circuitry of FIG. 1 are illustrated in FIG. 2. The top waveform is timing signal $\overline{RAS}$ and generally leads timing signal $\overline{CAS}$ by a short period of time. When input control signal CAS (not shown) goes high data sitting on line 17 and 21 are coupled to input nodes 19 and 23 respectively. As illustrated in FIG. 2, it is assumed that node 23 goes high. When node 23 goes high, transistor 11 is enabled and therefore output node 16 will go high when output latch clock signal OL goes high. When output disable signal OD goes low transistors 34 and 36 are no longer conductive and therefore no longer holding output nodes 15 and 16 at a low level, therefore, the high on output node 16 will cause transistor 32 to conduct thereby driving the OUTPUT node between transistors 32 and 33 to a high level which is indicated in FIG. 2 as DATA VALID. Note that when $\overline{RAS}$ goes high a slight glitch 50 is caused on the signal at output node 16 but because of the restoring circuit coupled to output node 16, output node 16 is not permanently deteriorated.

By now it should be appreciated that there has been provided a dynamic output buffer having a cross coupled sense amplifier which is effectively isolated from the memory or external circuit once the cross coupled sense amplifier is in a latched state thereby preventing any loss of data contained in the cross coupled sense amplifier. The cross coupled sense amplifier also has voltage restoring circuits coupled to its output so that as its input is pulled low the output will not be deteriorated.

We claim:

[1. A dynamic output buffer to buffer output data from a memory, comprising: a cross coupled sense amplifier having a first and a second input, a first and a second output and being controlled by a control signal; a first transistor coupled between the first input and a reference terminal and having a gate electrode, the gate electrode being coupled to the first output; a second transistor coupled between the second input and the reference terminal and having a gate electrode coupled to the second output; a third transistor coupled between the first input and the reference terminal and having a gate electrode coupled to an enabling signal; a fourth transistor coupled between the second input and the reference terminal and having a gate electrode coupled to the enabling signal so that when the third and fourth transistors are enabled the output data from the memory is prevented from entering the cross coupled sense amplifier; and output means to couple the output from the cross coupled sense amplifier to provide the output data from the memory.]

[2. The dynamic output buffer of claim 1 further including a fifth transistor coupled in parallel with the third transistor and having a gate electrode coupled to a second enabling signal, and a sixth transistor coupled in parallel with the fourth transistor and having a gate electrode coupled to the second enabling signal.]

[3. The dynamic output buffer of claim 1 further including a seventh transistor coupled between the first output and the reference terminal and having a gate electrode coupled to an output disabling signal, and an eighth transistor coupled between the second output and the reference terminal and having a gate electrode coupled to the output disabling signal.]

[4. The dynamic output buffer of claim 2 further including a ninth transistor coupled between a voltage terminal and the first output and having a gate electrode, a first coupling capacitor, a tenth transistor coupled between the first output and the first capacitor and having a gate electrode coupled to the voltage terminal, the gate electrode of the ninth transistor being coupled to the first capacitor so that the first capacitor can couple the second enabling signal to the ninth and tenth transistors, and an eleventh transistor coupled between the second output and the voltage terminal and having a gate electrode, a second coupling capacitor, a twelfth transistor coupled between the second output and the second coupling capacitor, the gate electrode of the eleventh transistor being coupled to the second capacitor so that the second capacitor can couple the second enabling signal to the eleventh and twelfth transistors.]

[5. The dynamic output buffer of claim 1 wherein the cross coupled sense amp includes thirteenth, fourteenth, fifteenth and sixteenth transistors each having a drain electrode, a source electrode, and a gate electrode, the drain electrodes of the thirteenth and fourteenth transistor being coupled to the control signal, the gate electrode of the thirteenth transistor being coupled to the first input, the gate electrode of the fourteenth transistor being coupled to the second input, the source electrode of the thirteenth transistor being coupled to the drain electrode of the fifteenth transistor, the source electrode of the fourteenth transistor being coupled to the drain electrode of the sixteenth transistor, the source electrodes of the fifteenth and sixteenth transistors being coupled to the reference terminal, the gate electrode of the fifteenth transistor being coupled to the source electrode of the fourteenth transistor and forming the first output, and the gate electrode of the sixteenth transistor being coupled to the source of the fourteenth transistor and forming the second output.]

6. A dynamic output buffer for buffering data and having a first and a second input and providing a buffer output, comprising: a cross coupled sense amplifier coupled to the first and second inputs and providing a first and a second output; an output driver coupled to the first and second outputs and providing the buffer output; first means coupled to the first input and controlled by the first output for shunting the first input; second means coupled to the second input and controlled by the second output for shunting the second input; third means coupled to the first input and controlled by an enabling signal to shunt the first input upon command from the enabling signal; fourth means coupled to the second input and controlled by the enabling signal to shunt the second input upon command from the enabling signal, a first restorer circuit coupled to the first output to restore the first output when the third means is enabled; and a second restorer circuit coupled to the second output to restore the second output when the fourth means is activated.

*7. A dynamic output buffer responsive to a clock signal, comprising:*

*a pair of cross coupled amplifiers for providing a first and a second output on first and second output nodes, respectively;*

*a first load transistor interposed between the clock signal and the first output node and having a control electrode for receiving a first data signal;*

*a second load transistor interposed between the clock signal and the second output node and having a control electrode coupled to a second data signal, said second data signal being complementary to said first data signal;*

*a first enable transistor having a control electrode for receiving an enable signal which occurs before the clock signal is terminated, a first current electrode coupled to the control electrode of the first load transistor, and a second current electrode coupled to a reference level; and*

*a second enable transistor having a control electrode for receiving the enable signal, a first current electrode coupled to the control electrode of the second load transistor, and a second current electrode coupled to the reference level;*

*whereby the enable signal causes the control electrodes of the load transistors to be shunted to the reference level to open the load transistors to isolate the pair of cross coupled amplifiers from the clock signal.*

*8. The dynamic output buffer of claim 7 further comprising:*

*a fifth transistor having a control electrode coupled to the enable signal, a first current electrode coupled to a supply voltage, and a second current electrode coupled to the first output node; and*

*a sixth transistor having a first current electrode coupled to the control electrode of the fifth transistor, a second current electrode coupled to the first output node, and a control electrode coupled to the supply voltage;*

*a first coupling capacitor coupled between the control electrode of the fifth transistor and the enable signal;*

*a seventh transistor having a first current electrode coupled to the supply voltage, a second current electrode coupled to the second output node, and a control electrode;*

*an eighth transistor having a first current electrode coupled to the control electrode of the seventh transistor, a second current electrode coupled to the second output node, and a control electrode coupled to the supply voltage; and*

*a second coupling capacitor coupled between the control electrode of the seventh transistor and the enabling signal.*

* * * * *